United States Patent
Boroditsky et al.

(10) Patent No.: US 8,072,273 B2
(45) Date of Patent: Dec. 6, 2011

(54) SYSTEM EMPLOYING SYNCHRONIZED CRYSTAL OSCILLATOR-BASED CLOCK, TO BE USED IN EITHER DISCRETE OR INTEGRATED APPLICATIONS

(75) Inventors: Roman Boroditsky, Hallandale Beach, FL (US); Jorge Gomez, Surfside, FL (US)

(73) Assignee: NEL Frequency Controls, Inc., Burlington, WI (US)

( * ) Notice: Subject to any disclaimer, the term of this patent is extended or adjusted under 35 U.S.C. 154(b) by 0 days.

(21) Appl. No.: 12/901,008

(22) Filed: Oct. 8, 2010

(65) Prior Publication Data

US 2011/0068839 A1    Mar. 24, 2011

Related U.S. Application Data

(63) Continuation-in-part of application No. 12/398,807, filed on Mar. 5, 2009, now Pat. No. 7,812,682, and a continuation of application No. 12/550,084, filed on Aug. 28, 2009, now abandoned.

(51) Int. Cl.
  *H03L 7/00* (2006.01)
  *H03L 7/24* (2006.01)
(52) U.S. Cl. .......... 331/55; 331/173; 331/172; 327/141; 327/144
(58) Field of Classification Search ............ 331/172, 331/173, 55; 327/141, 144
  See application file for complete search history.

(56) References Cited

U.S. PATENT DOCUMENTS

| | | |
|---|---|---|
| 3,592,960 A | 7/1971 | Cushing et al. |
| 4,166,984 A | 9/1979 | Jenkins |
| 5,604,468 A | 2/1997 | Gillig |
| 5,929,713 A | 7/1999 | Kubo et al. |
| 6,154,095 A | 11/2000 | Kano et al. |
| 6,166,609 A | 12/2000 | Nakamiya et al. |

(Continued)

FOREIGN PATENT DOCUMENTS

WO    WO 02082656    10/2002

OTHER PUBLICATIONS

Stephens et al.; The Future of Multi-Clock Systems, DesignCon 2008. Feb. 4-7, 2008.

(Continued)

*Primary Examiner* — Joseph Chang
(74) *Attorney, Agent, or Firm* — Nicholas A. Kees; Godfrey & Kahn, S.C.

(57) ABSTRACT

A synchronized clock system, for use with an electronic system having several system nodes requiring a synchronized clock signal. The clock system may be formed in either discrete form or in integrated form, or in any combination, and includes a first synch bus and a second synch bus, isolated from the first synch bus, and at least one pair and preferably several pairs of SXO modules connected to the busses in alternating fashion. Each of the system nodes is connected at a different one of any number of arbitrarily selected connection points anywhere along the first bus. The points along the busses at which the SXO modules are connected are spaced roughly equidistantly apart. The system nodes are connected to the bus by means of signal conditioning circuits, which may include correction circuits, an amplifier, a frequency multiplier, a logic translator and a fan buffer.

22 Claims, 2 Drawing Sheets

U.S. PATENT DOCUMENTS

| | | |
|---|---|---|
| 6,198,337 B1 | 3/2001 | Matsuura |
| 6,259,285 B1 | 7/2001 | Woods |
| 6,696,898 B1 | 2/2004 | Ward et al. |
| 7,003,062 B1 | 2/2006 | Leyn |
| 7,528,682 B2 | 5/2009 | Kawashima |
| 2005/0280455 A1 | 12/2005 | Hutson |
| 2008/0105054 A1 | 5/2008 | Kanai et al. |
| 2011/0050297 A1* | 3/2011 | Boroditsky et al. ........... 327/141 |

OTHER PUBLICATIONS

Mansuri. Low-Power Low-Jitter On-Chip Clock Generation. Department of Electrical Engineering. University of California—Los Angeles. 2003.

International Search Report for application No. PCT/US2010/025554; mailed May 3, 2010.

* cited by examiner

SYSTEM EMPLOYING SYNCHRONIZED CRYSTAL OSCILLATOR-BASED CLOCK, TO BE USED IN EITHER DISCRETE OR INTEGRATED APPLICATIONS

CROSS REFERENCE TO RELATED APPLICATIONS

This patent application is a continuation-in-part of U.S. patent application Ser. No. 12/398,807, filed Mar. 5, 2009, entitled "Crystal-Based Oscillator For Use In Synchronized System," which is now U.S. Pat. No. 7,812,682, issued on Oct. 12, 2010. This application is also a continuation of U.S. patent application Ser. No. 12/550,084, filed Aug. 28, 2009, now abandoned entitled "System Employing Synchronized Crystal Oscillator-Based Clock."

BACKGROUND OF THE INVENTION

This invention relates to clock systems using crystal oscillators, and in particular to such systems employing numerous crystal oscillators in a synchronized clock system.

Clock signals are the most important control signals in digital systems. Regardless of the modulation scheme, the timing of logic transitions is dictated by the system's clock. The performance of a system at any level—within a core or chip, across cores on an integrated chip, across chips on a board, or across boards—is predicated by the coordination of clock signals among the components. Example known applications can be described as follows.

Synchronous Systems. Synchronous systems provide clock signals that are frequency locked at every transmission/reception exchange and require a design with zero skew to set the phase relationship between signal and clock. Difficulties in coordinating clock signals in synchronous systems differ at the chip, circuit, and system levels. On a chip, a single clock is easily distributed to drive every element and data-clock skew is easily controlled. The situation is more complicated at the circuit (multi-chip) and system (multi-board) levels. Synchronization requires that either (1) a central clock be distributed across the circuit, (2) independent clocks local to circuit components be frequency locked, or (3) a low frequency reference clock be distributed across the circuit and multiplied up to the data rate at each component. Each of these solutions used in current systems introduces another layer of problems in component cost, design complexity, increased jitter and noise, and reduced reliability. Additionally, the difficulties increase further with component count and separation distance.

In an ideal synchronous circuit, every change in the logic levels of every component is defined by the level change of a common clock signal simultaneously; the timing of all events can be safely assumed, and there is no need for active components to monitor and coordinate the timing of different events. The real world, however, is nothing like the ideal. In real circuits, logic transitions have finite rise/fall times, signals take time to propagate, and registers have nonzero latch times. All of these factors and more combine to dictate the maximum possible system speed. At the chip level, the combination of the clock quality and the delay of each component on a chip set a limit on the maximum clock speed. At the circuit and system levels, things are different, all events may not be simultaneous, but conventionally the timing of every event needs to be in some way coordinated at the system level nonetheless. In inter-board systems (e.g. server blade applications), a module operating in one clock domain inevitably needs to send data to another module operating in a second clock domain Currently the most common synchronous systems distribute a common clock signal by fanning out a master clock to each component of the system. A single input clock signal is re-driven by several output buffers. The buffers have propagation delay, though fan-outs are available that incorporate phase-locked loops (PLLs) to eliminate skews between the outputs. However, PLLs introduce jitter. When more than one fan-out part is required, it is important to include adjustable delay in the circuit to eliminate skew between fan-out models. In many current applications, a low frequency clock is fanned out across a system and the clock is multiplied to the data rate at each component. The jitter of the PLL multiplier's Voltage Controlled Oscillator (VCO) is added to the clock signal and, as a result of multiplication, the jitter of the clock itself increases as the square of the multiplication factor.

Another current technique for clock distribution is to simply daisy chain a single clock signal across the system. At each component, a well-tuned delay must be provided to synchronize the system. In practice, it is difficult to match impedances so perfectly that the clock signal isn't reflected at each tap. Multiple reflections interfere with the signal and introduce noise and jitter.

Skew is the fixed timing between two signals. The primary cause of skew is the difference in trace length, but anything that affects signal propagation can contribute: trace width and impedance, variations in dielectric constants, and temperature. If the receiver samples the data on the rising edge of the clock signal, then as long as the clock provides the receiver a rising edge at the right time, there is no relevant skew. However, taking jitter into account, assuring that the same clock edge that was used to generate a data transition is also used to strobe that transition at the receiver can dramatically decrease the effective jitter of the system. If the data system and the clock signal both have the same jitter, they can trace each other. Ensuring that the clock used in a receiver has the same jitter as the data is one of the driving motivations for adopting asynchronous architectures.

Asynchronous Systems. Asynchronous systems have more autonomous components than synchronous systems; they are not frequency-locked or phase-locked and, between components, delay and skew are not an issue. At the transmitter, the clock signal determines logic transitions and, at the receiver, rather than simple incoming data with the trivial assumption of synchronous timing, a separate clock must be at least temporarily phase-locked and frequency-locked so that bits can be sampled at their centers.

Current asynchronous architectures have several advantages over synchronous designs at the inter-board level, few advantages at the circuit level, and, except in the most rare cases, no advantages at the chip level. Asynchronous systems solve several of the problems presented by common synchronous systems: fan-out and the associated increased jitter does not present a problem, skew is not a problem, and having multiple clocks reduces the possibility of catastrophic central clock failure. The autonomous nature of asynchronous architecture provides scalability and redundancy. The reduced coordination between boards provides for easier addition and subtraction as needed.

However, different components must still communicate in the systems, and to do so, an element of synchronization is required. The first sacrifice made in moving from a synchronous to an asynchronous architecture is the seamless transparent timing of each event in the system. This amounts to surrendering the ultra-high performance that can only be attained in a system where every event occurs in harmony. One way to achieve the level of synchronization necessary for communication in an asynchronous system is to have the transmission of a data signal controlled by one clock, and its reception controlled by another. Another way is to use a clock recovery system. Here, the VCO of a PLL is locked to the transitions of the incoming data and is used to strobe the receiver; the clock used to reconstruct incoming data is embedded in the data itself. Other than within the clock recovery circuit where the positioning of the strobe must be well centered in the setup and hold comfort zone of the receiver, problems with skew are eliminated. The wider the bandwidth of the clock recovery circuit, the more that jitter on the clock tracks jitter on the data. In some designs, a low frequency clock signal is distributed to the receiver to aid the clock recovery circuit. PLL-based clock recovery circuits are expensive components, and the digital alternative, a Phase Interpolator (PI), is less expensive but more difficult to characterize. PIs are also more likely to suffer nonlinear effects and usually require a distributed clock.

The general concept of having two synchronization busses and connecting clock modules to them alternatingly was described in The Future of Multi-Clock Systems, by Ransom Stephens, Roman Boroditsky and Jorge Gomez, DesignCon 2008. That paper described a synchronous clock circuit with the Sync In of a first SXO module being connected to the Sync A bus, the Sync Out of the first SXO module being connected to the Sync B bus, the Sync In of a second SXO module being connected to the Sync B bus, the Sync Out of the SXO second module being connected to the Sync A bus.

This invention relates to improvements to the systems described above, and to solutions to some of the problems raised or not solved thereby.

SUMMARY OF THE INVENTION

The invention therefore provides a synchronized clock system, in either discrete form or integrated, for use with an electronic system, which again may be discrete, integrated, or mixed, but in any event having several system nodes requiring a synchronized clock signal. The clock system includes a first synch bus, and a second synch bus isolated from the first synch bus. At least one pair of SXO modules are included, and preferably several pairs of SXO modules. Each SXO module has a Synch IN terminal and a Synch OUT terminal. The SXO modules are connected to the busses in alternating fashion. That is, one of any adjacent pair of the SXO modules is connected to the first synch bus by its Synch IN terminal, and is connected to the second synch bus by its Synch OUT terminal. The other of the adjacent pair of the SXO modules is connected to the second synch bus by its Synch IN terminal, and is connected to the first synch bus by its Synch OUT terminal. Each of the system nodes is connected at a different one of any number of arbitrarily selected connection points anywhere along the first bus. The first and second synch busses each have two ends, and for each bus, those two ends are terminated. Alternatively, the busses are arranged in a loop configuration. The points along the busses at which the SXO modules are connected are spaced roughly equidistantly apart. The system nodes are connected to the bus by means of signal conditioning circuits, which may include correction circuits, an amplifier, a frequency multiplier, a logic translator and a fan buffer.

Other objects and advantages of the invention will become apparent hereinafter.

DETAILED DESCRIPTION OF THE INVENTION

Figure 1:
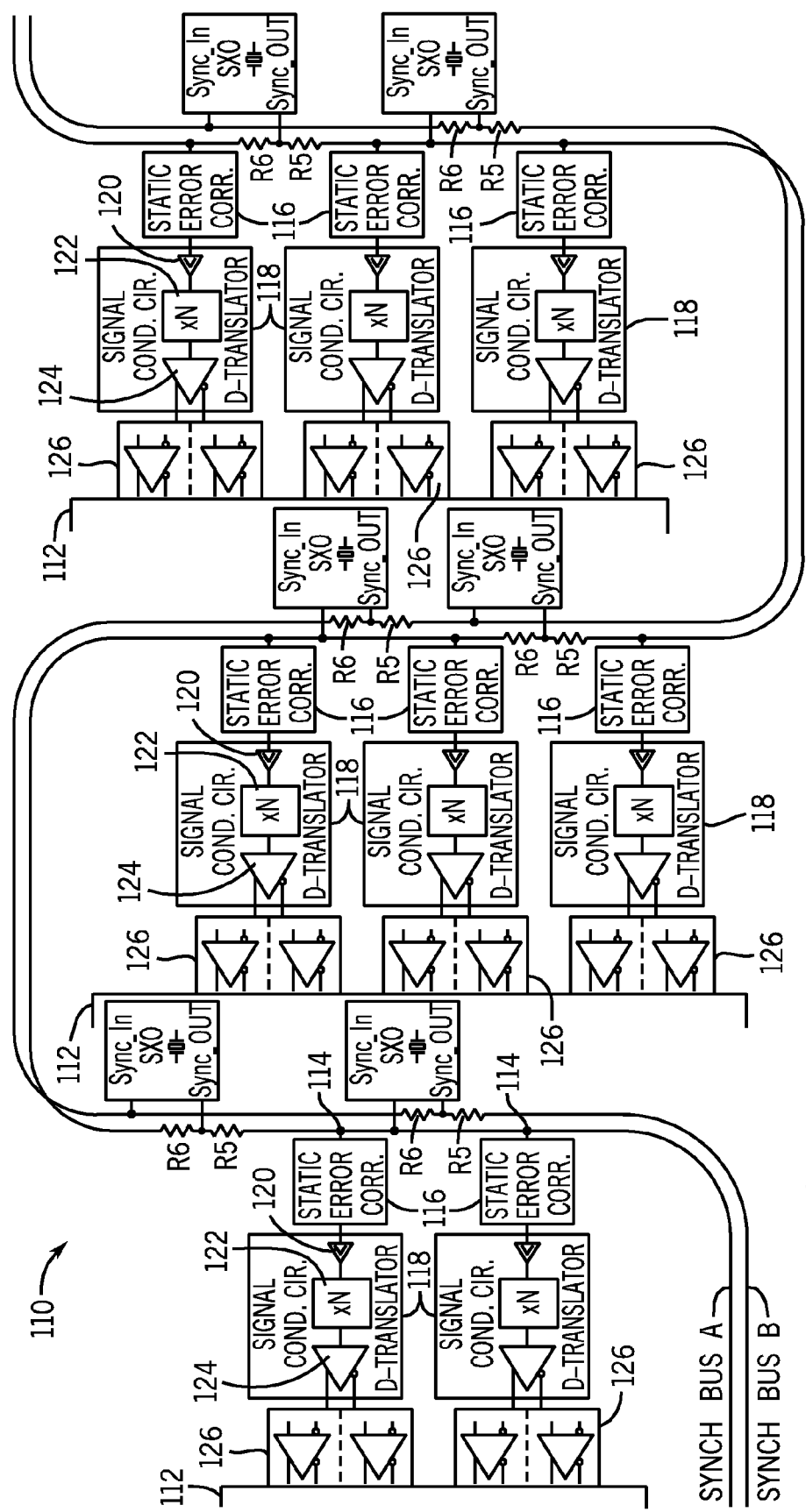
FIG. 1 is a schematic diagram of an electronic system employing a synchronous clock system that uses a plurality of the crystal-based oscillator modules according to the invention.
Figure 2:
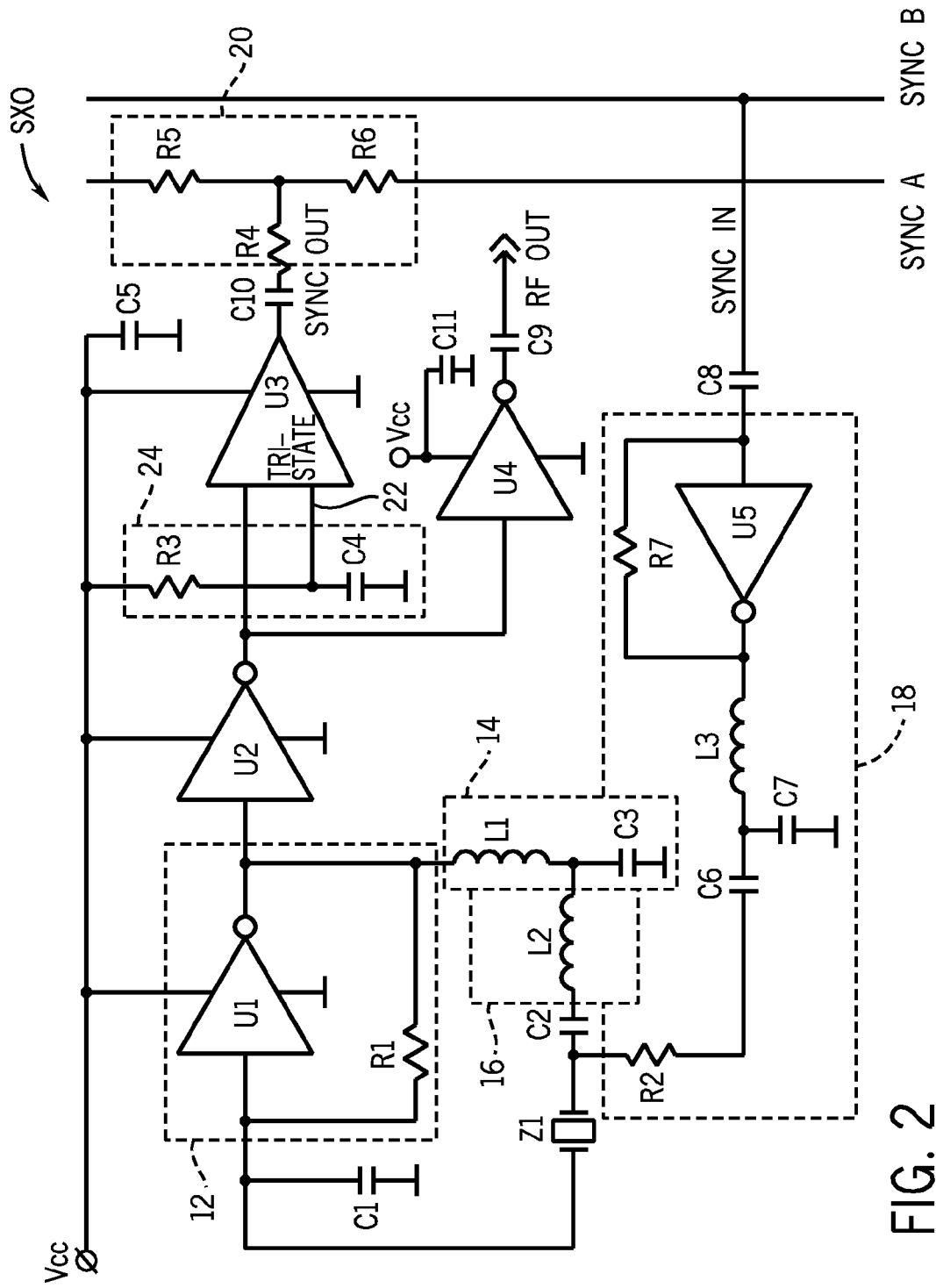
FIG. 2 is a schematic diagram of an example of a crystal-based oscillator module of the type that could be used in a system as shown in FIG. 1.

As shown in FIG. 1, a clock system 110 is shown for use with an electronic system 112 that requires a clock system. Clock system 110 as herein described may be formed entirely in an integrated circuit, or alternatively a circuit formed by a collection of integrated chips and discrete components, or may be formed entirely of discrete components. Similarly, electronic system 112 may be an integrated circuit, or alternatively a circuit formed by a collection of integrated chips and/or discrete components. The clock system 110 includes two synchronization busses, Synch Bus A and Synch Bus B. To Synch Bus A and Synch Bus B are connected a plurality of substantially identical synchronized crystal oscillator modules SXO. By "substantially identical" is meant that all the SXO modules are specified to have the same or exactly equivalent components, and the only variations are based on the tolerances within those components. A diagram of one example of an SXO module that is appropriate for this system is shown in FIG. 2, and is described in more detail in application Ser. No. 12/398,807, filed Mar. 5, 2009, which is now U.S. Pat. No. 7,812,682, issued on Oct. 12, 2010. The information disclosed in that patent is incorporated herein by reference in its entirety.

The busses Synch A and Synch B run substantially throughout the electronic system 112, and the SXO modules are connected to the busses and themselves spaced roughly equidistantly apart along the busses. By the phrase "spaced roughly equidistantly apart" is meant that the largest distances between adjacent SXO modules along the bus are about 20% larger than the smallest distances between SXO modules along the bus. Each SXO module has a Synch IN terminal and a Synch OUT terminal, and for each SXO module, one of those two terminals is connected to the Synch A bus, and the other to the Synch B bus. Further, moving along the busses, the SXO modules are connected to the busses in alternating fashion, that is, each SXO module is connected the opposite to the way the two adjacent ones are connected. To elaborate further, if one SXO module has its Synch IN terminal connected to the Synch A bus and its Synch OUT terminal connected to the Synch B bus, each of the two SXO modules adjacent to that module along the bus will be connected the opposite way, with their Synch IN terminals connected to the Synch B bus and their Synch OUT terminals connected to the Synch A bus. Resistors R5 and R6 shown connected in series with the busses at each Synch OUT terminal are part of each module, and serve the purpose of impedance matching.

In the preferred embodiment, busses Synch A and Synch B are terminated, generally by matching the characteristic impedance of the trace physically formed on the printed circuit board. In most cases that would mean the use of a 50 Ohm resistor. In an alternative embodiment, the busses could be endless. That is, each bus could have its two ends connected together to each other in a loop fashion, so that each bus forms a loop, while still maintaining the separation or isolation of each bus from the other.

As shown in FIG. 1, the system nodes 114, of the electronic system 112 that require a synchronized clock signal, are connected to a selected one of the busses Synch A and Synch B, anywhere along the selected bus. The reason a single bus is selected for connection of the nodes is so as to minimize phase synchronization and skew issues. In FIG. 1 as shown, the Synch A bus was selected. If phase synchronization and skew are not concerns, then any particular system node 114 could be connected to either bus.

The synchronized clock signal may be tapped off at any point along the bus. If static phase error is needed to be corrected, the synchronized signal is run through a correction circuit 116, which inserts a known amount of delay so as to correct the static phase error. Either way, the signal is then fed into a signal conditioning circuit 118. Signal conditioning circuit 118 includes an amplifier 120. Optionally, if the system clock frequency is higher than practical for the bus frequency, the signal conditioning circuit may also include a frequency multiplier 122. A logic translator 124 may also be included, in order to adapt to whatever logic the electronic system 112 is using, as the busses Synch A and Synch B are running essentially a sine-wave. Most likely, logic translator 124 would be a differential translator. From that point the clock signal, originating with the SXO modules but now suitably conditioned, can be fed directly into a system node 114. Alternatively, the clock signal can be fed into a fan buffer 126 if required.

Generally the system works best with an even number of SXO modules, that is, they are applied generally in pairs. The absolute minimum to achieve a functional system would be a single pair, although a system with a single pair would sacrifice functionality if even a single SXO module were to fail. That is, if a synch signal were tapped off a bus where there had been a single pair of SXO modules, and where one of the modules had failed, the signal tap would have no synch signal. A greater number of pairs is needed to provide the functionality and advantages of the invention. While there is not necessarily a particular "optimum" number, the optimum would be dependent upon bus length. A number of pairs should be provided so that a maximum distance between two pairs would not exceed the distance at which the attenuation of the synch signal would create problems. Generally that maximum distance would be several inches of length along the bus.

The number of system nodes 114 can be much greater than the number of SXO pairs. As long as SXOs are spread roughly equidistantly and within few inches from each other, the number of tap-offs can be as large as practical and not necessarily equal. Literally, there could be one tap-off from the section of the bus between a particular pair of SXO modules (or none), and ten or more tap-offs between the next pair. About the only limit would be if the total input impedance overloaded the bus and caused synch signal attenuation.

This clock system 110 include several advantages. One advantage is synchronicity. That is, all points on a particular bus are synchronous in frequency and if there is any dynamic phase error at all, it is small enough that it can be ignored. Further, static phase error, which will be constant for each node, can be corrected if needed. Skew will be very minimal and will be determined by the skew of the fan-out buffer 26 if used.

Another advantage is redundancy, improving reliability. A failure of any arbitrary number of individual SXO modules cannot lead to the system failure. All remaining units will stay synchronous and provide a stable and synchronized signal on the buses to be tapped off by the system. Of course, if there is no master clock, there is no single point of failure. Moreover, oscillator start-up problems are avoided, as any SXO module with a potential problem will receive a jump-start from the bus Synch IN signal from the other SXO modules.

Yet another advantage is signal integrity, or lack of noise. The signal on either bus is cleaned up by the recursive filtering of each SXO module. The level of phase noise and jitter on either bus signal is as good as the best SXO module in the system.

While the apparatus described above is effectively adapted to fulfill its intended objectives as set forth, it is to be understood that the invention is not intended to be limited to the specific preferred embodiments of synchronized crystal oscillator module as described in this description. Rather, it is to be taken as including all reasonable equivalents to the subject matter of the claims as set out below.

The invention claimed is:

1. A synchronized clock system, for use with an electronic system with a plurality of system nodes requiring a synchronized clock signal, the clock system comprising:
   a first synch bus;
   a second synch bus, isolated from the first synch bus;
   at least one pair of synchronized crystal oscillator modules, each synchronized crystal oscillator module having a Synch IN terminal and a Synch OUT terminal, one of said pair being connected to the first synch bus by means of its Synch IN terminal and connected to the second synch bus by means of its Synch OUT terminal, and the other of said pair being connected to the second synch bus by means of its Synch IN terminal and connected to the first synch bus by means of its Synch OUT terminal;
   each of said system nodes being connected at a different one of arbitrarily selected connection points anywhere along the first bus.

2. A clock system as recited in claim 1 wherein one or more of the synch busses and the synchronized crystal oscillator are formed on an integrated circuit.

3. A clock system as recited in claim 1 wherein two or more of the synch busses and the synchronized crystal oscillator modules are formed on the same integrated circuit.

4. A clock system as recited in claim 1 wherein all of the synch busses and the synchronized crystal oscillator modules are formed on the same integrated circuit.

5. A clock system as recited in claim 1 wherein the first and second synch busses each have two ends, and for each bus, those two ends are terminated by a resistor matching characteristic physical impedance of the bus itself.

6. A clock system as recited in claim 1 wherein at least one of the first and second synch busses is arranged in a loop configuration.

7. A clock system as recited in claim 1 wherein the points along the busses at which the synchronized crystal oscillator modules are connected are spaced roughly equidistantly apart.

8. A clock system as recited in claim 1 wherein the system node is connected to the bus by means of a signal conditioning circuit.

9. A clock system as recited in claim 8 wherein the signal conditioning circuit is connected to the bus by means of a correction circuit.

10. A clock system as recited in claim 8 wherein the signal conditioning circuit includes an amplifier.

11. A clock system as recited in claim 10 wherein the signal conditioning circuit includes a frequency multiplier.

12. A clock system as recited in claim 10 wherein the signal conditioning circuit includes a logic translator.

13. A clock system as recited in claim 8 wherein the signal conditioning circuit is connected to the system node by means of a fan buffer.

14. A synchronized clock system, for use with an electronic system with a plurality of system nodes requiring a synchronized clock signal, the clock system comprising:
  a first synch bus;
  a second synch bus, isolated from the first synch bus;
  at least two pairs of synchronized crystal oscillator modules, each synchronized crystal oscillator module having a Synch IN terminal and a Synch OUT terminal, wherein one of the synchronized crystal oscillator modules is connected to the first synch bus by means of its Synch IN terminal and connected to the second synch bus by means of its Synch OUT terminal, and each of the adjacent synchronized crystal oscillator modules being connected to the second synch bus by means of its Synch IN terminal and connected to the first synch bus by means of its Synch OUT terminal;
  each of the system nodes being connected at a different one of arbitrarily selected connection points anywhere along either bus.

15. A clock system as recited in claim 14 wherein one or more of the synch busses and the synchronized crystal oscillator modules are formed on an integrated circuit.

16. A clock system as recited in claim 14 wherein two or more of the synch busses and the synchronized crystal oscillator modules are formed on the same integrated circuit.

17. A clock system as recited in claim 14 wherein all of the synch busses and the synchronized crystal oscillator modules are formed on the same integrated circuit.

18. A clock system as recited in claim 14, wherein each of the system nodes is connected at a different one of arbitrarily selected connection points anywhere along the same bus.

19. An integrated electronic system with a plurality of system nodes requiring a synchronized clock signal, and including a synchronized clock system, the clock system comprising:
  a first synch bus;
  a second synch bus, isolated from the first synch bus;
  at least two pairs of synchronized crystal oscillator modules, each synchronized crystal oscillator module having a Synch IN terminal and a Synch OUT terminal, wherein one of the synchronized crystal oscillator modules is connected to the first synch bus by means of its Synch IN terminal and connected to the second synch bus by means of its Synch OUT terminal, and each of the adjacent synchronized crystal oscillator modules being connected to the second synch bus by means of its Synch IN terminal and connected to the first synch bus by means of its Synch OUT terminal;
  each of the system nodes being connected at a different one of arbitrarily selected connection points anywhere along one of the first and second busses.

20. A clock system as recited in claim 19 wherein one or more of the synch busses and the synchronized crystal oscillator modules are formed on an integrated circuit.

21. A clock system as recited in claim 19 wherein two or more of the synch busses and the synchronized crystal oscillator modules are formed on the same integrated circuit.

22. A clock system as recited in claim 19 wherein all of the synch busses and the synchronized crystal oscillator modules are formed on the same integrated circuit.

* * * * *